United States Patent [19]
Manning

[11] Patent Number: 5,831,895
[45] Date of Patent: Nov. 3, 1998

[54] DYNAMIC CELL PLATE SENSING AND EQUILIBRATION IN A MEMORY DEVICE

[75] Inventor: Troy A. Manning, Boise, Id.

[73] Assignee: Micron Technology, Inc., Boise, Id.

[21] Appl. No.: 903,541

[22] Filed: Jul. 30, 1997

[51] Int. Cl.⁶ ................................................ G11C 11/24
[52] U.S. Cl. ........................................ 365/149; 365/207
[58] Field of Search .................................. 365/149, 207, 365/206

[56] References Cited

U.S. PATENT DOCUMENTS

| | | | |
|---|---|---|---|
| 5,132,575 | 7/1992 | Chern | 307/530 |
| 5,175,450 | 12/1992 | Chern | 307/530 |
| 5,267,214 | 11/1993 | Fujishima et al. | 365/149 |
| 5,325,331 | 6/1994 | Parkinson et al. | 365/189.06 |
| 5,500,824 | 3/1996 | Fink | 365/201 |

*Primary Examiner*—David C. Nelms
*Assistant Examiner*—David Lam
*Attorney, Agent, or Firm*—Schwegman, Lundberg, Woessner & Kluth, P.A.

[57] ABSTRACT

A memory device is described which uses dynamic digitline sensing where separate plate lines are provided for each digitline of a memory cell array. A voltage of the plate line is dynamic in that it changes during read operations to create a larger differential for sensing stored data. A method is described which uses either an inactive digitline or a simulation circuit to perform an equilibration operation. Thus, the memory uses an inactive digitline for equilibration which is not necessary for data sensing.

9 Claims, 4 Drawing Sheets

DYNAMIC CELL PLATE SENSING AND EQUILIBRATION IN A MEMORY DEVICE

TECHNICAL FIELD OF THE INVENTION

The present invention relates generally to memory circuits and in particular the present invention relates to memory circuit sensing and equilibration.

BACKGROUND OF THE INVENTION

A modern DRAM memory cell consists of one MOS access transistor and one storage capacitor referred to as a one-transistor one-capacitor (1T1C) cell. The memory cell access transistor operates as a switch, interposed between the memory cell capacitor and a digitline. The memory cell is capable of holding a single piece of binary information, as stored electric charge in the cell capacitor. Given a bias voltage of Vcc/2 on the capacitor's common node, a logic one level is represented by +Vcc/2 volts across the capacitor and a logic zero is represented by −Vcc/2 volts across the capacitor.

The digitline consists of a conductive line connected to a multitude of memory cell transistors. Generally, either metal or polysilicon forms the conductive line. Due to the large quantity of attached memory cells, its physical length, and proximity to other features, the digitline is very capacitive.

The memory cell transistor's gate terminal connects to a wordline. The wordline, which connects to a multitude of memory cells, consists of an extended segment of the same polysilicon used to form the transistor's gate. The wordline is physically orthogonal to the digitline.

A pair of digitlines are typically fabricated as two adjacent digitlines. The digitlines are initially equilibrated at Vcc/2 volts, and all wordlines are initially at zero volts, which turns off the memory cell access transistors. To read a memory cell, its wordline transitions to a voltage that is at least one transistor $V_{th}$ above Vcc. This elevated wordline voltage level is referred to as Veep or Vpp. When the wordline voltage exceeds one $V_{th}$ above the digitline equilibrate voltage (Vcc/2) and the memory cell access transistor turns on, the memory cell capacitor begins to discharge onto a digitline. Essentially, reading or accessing a memory cell results in charge sharing between the memory cell capacitor and the digitline capacitance. This sharing of charge causes the digitline voltage to either increase for a stored logic one or decrease for a stored logic zero. Ideally, the access will only modify the active digitline, leaving its complement digitline unaltered. Thus, a differential voltage develops between the two digitlines.

After the cell access is complete, a sensing operation is performed. The reason for forming a digitline pair is to allow for the use of a differential sense amplifier circuit. The sense amplifier typically consists of a cross-coupled PMOS transistor pair and a cross-coupled NMOS transistor pair. As discussed in the preceding paragraph, a signal voltage develops between the digitline pair when the memory cell access occurs. While one digitline contains charge from the cell access, the other digitline serves as a reference for the sensing operation. The sense amplifier firing generally occurs sequentially rather than concurrently. The N-sense-amp fires first and the P-sense-amp second.

In another memory architecture, a common plate of the array of memory cell capacitors is used as a reference for the sense amplifier circuitry. This scheme, therefore, changes the traditional differential digitline sensing and equilibration operations. Using a common plate for the entire memory array creates a large capacitive reference which remains stable during memory accesses. For the reasons stated above, and for other reasons stated below which will become apparent to those skilled in the art upon reading and understanding the present specification, there is a need in the art for a new method of dynamic digitline sensing and equilibration where low voltage memories can experience larger differential voltages during memory read operations.

SUMMARY OF THE INVENTION

The above mentioned problems with memory devices and other problems are addressed by the present invention and which will be understood by reading and studying the following specification. A dynamic digitline memory is described which uses inactive digitlines or simulation circuitry during equilibrate operations.

In particular, the present invention describes a method of operating a memory device having dynamic digitlines. The memory device comprises a plurality of memory cell arrays arranged in rows and columns, each column defined by a digitline and a common memory cell plate line. The method comprises the steps of sensing data stored in a memory cell located in an active memory array using a differential sense amplifier circuit. The sense amplifier circuit has two sensing nodes; a first node coupled to an active digitline of the active memory array, and a second node coupled to a memory cell plate corresponding to the active digitline. The method further comprises the steps of electrically isolating the memory cell from the active digitline, coupling an inactive digitline from an inactive memory array to a second node of the sense amplifier circuit, driving the inactive digitline to an opposite data state as the active digitline, and electrically coupling the first and second nodes of the sense amplifier circuit to equilibrate the active and inactive digitlines to an intermediate voltage level.

In another embodiment, a method is described for operating a memory device comprising an array of memory cells arranged in rows and columns, each column defined by a digitline and a corresponding memory cell plate line conductor strip. The method comprises the steps of selectively coupling a memory cell to a digitline through an access transistor, charge sharing the memory cell with the digitline to modify a voltage of the digitline, and coupling the digitline to a first node of a sense amplifier circuit, coupling a second node of the sense amplifier circuit to a memory cell plate corresponding to the active digitline. The method further comprises the steps of activating the sense amplifier circuit to drive the digitline to a voltage level representing data stored on the memory cell, electrically isolating the memory cell from the digitline, and coupling a dummy load to a second node of the sense amplifier. The dummy load has a capacitance substantially equal to a capacitance of the digitline. Also included in the method are the steps of: driving a voltage of the dummy load to a voltage level representing an opposite data state of the data stored on the memory cell; deactivating the sense amplifier circuit; coupling the memory cell plate line conductor strip corresponding to the digitline to the second node of the sense amplifier circuit; and equilibrating the digitline, dummy load and the memory cell plate line conductor strip to a common voltage using an equilibrate transistor coupled to the first and second nodes of the sense amplifier circuit.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
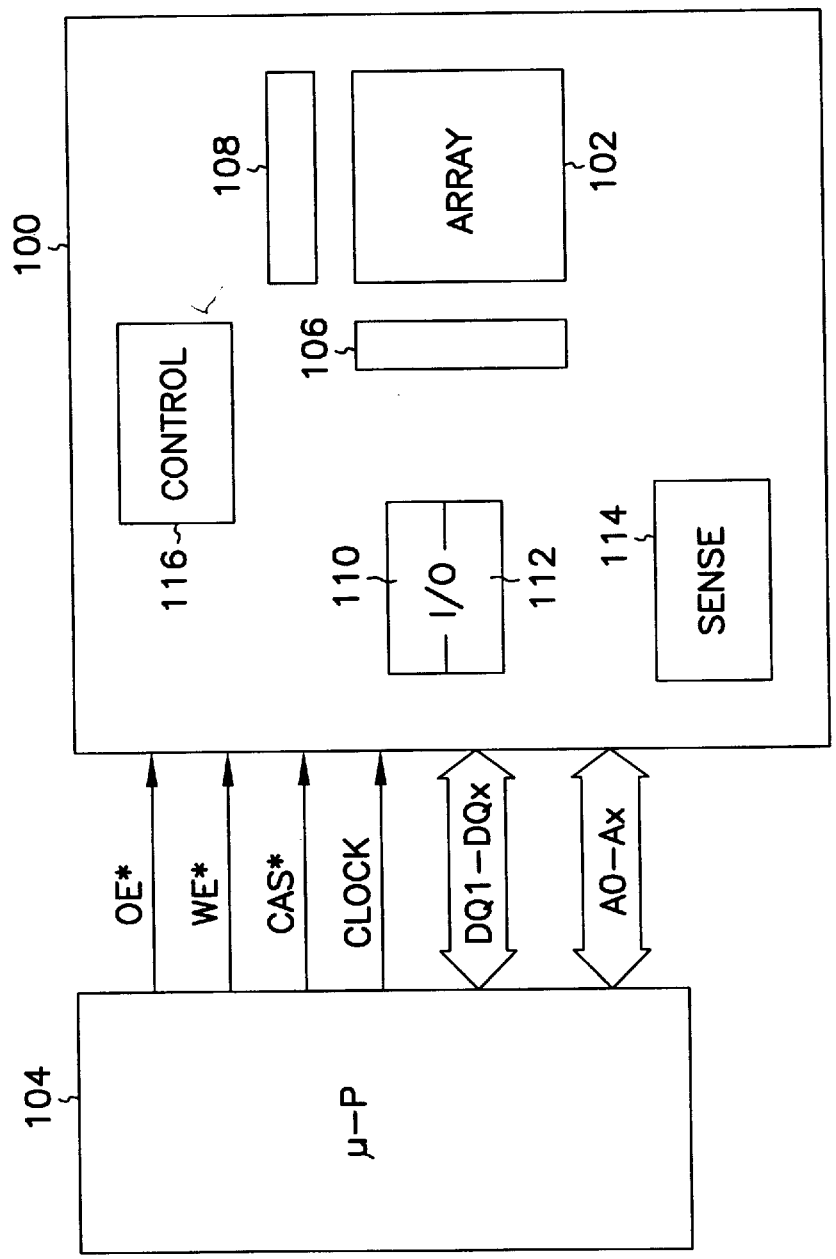
FIG. 1 is a block diagram of a memory device of the present invention.

A DRAM 100 is described in reference to FIG. 1 as having a memory array 102 and associated circuitry for reading from and writing to the memory array. The DRAM array can be accessed by a microprocessor 104, memory controller, a chip set, or other external system through input/output connections including address lines AO–Ax. Row decoder 106 decodes a row address from an address signal provided on AO–Ax, and addresses the corresponding row of the DRAM array. Likewise, column decoder 108 decodes a column address from an address signal provided on AO–Ax, and addresses the corresponding column of the DRAM array. Data stored in the DRAM array can be transferred to outputs DQ1–DQx through the data output buffer 1 10. Likewise, data input buffer 112 is used to receive data from DQ1–DQx and transfer the data to the DRAM array. Sense amplifier circuitry 114 is provided to sense and amplify data stored on the individual memory cells of the DRAM array. Control circuitry 116 is provided to monitor the memory circuit inputs and control reading and writing operations.

The input and output connections of the DRAM 100 used to communicate with the microprocessor 104 are described as follows. Output enable (OE*) enables the output buffer 110 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines AO–Ax are used to identify a row and column address. DRAM data input/output lines DQ1–DQx provide data input and output for the DRAM. An optional clock signal can be provided by the microprocessor as described below for operating the memory circuit in a synchronous mode.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above.

Figure 2:
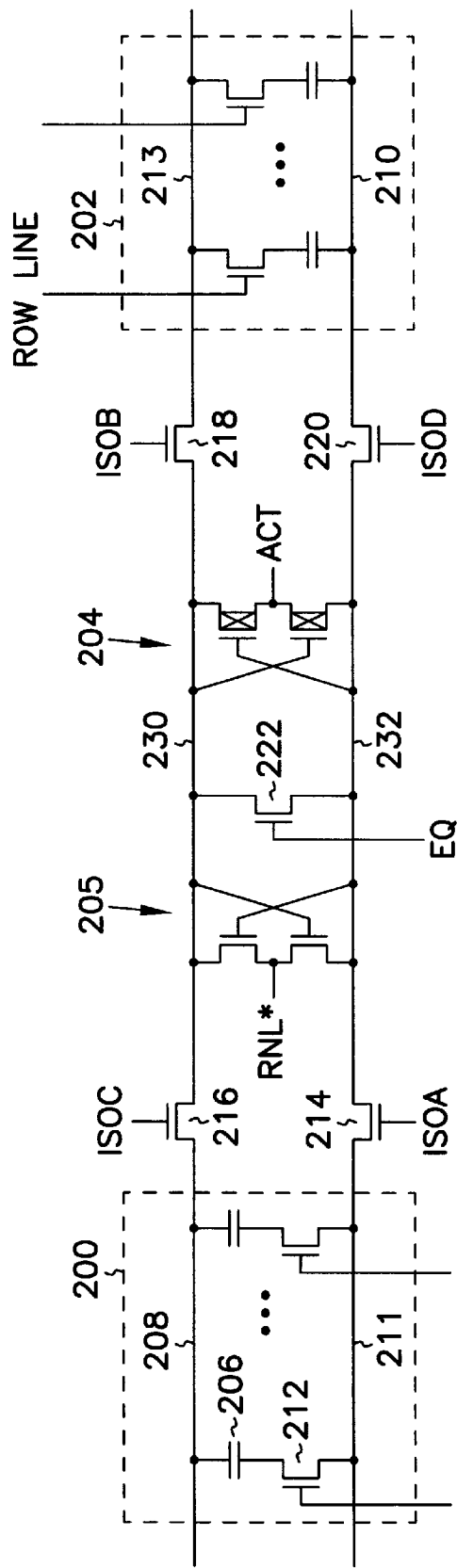
FIG. 2 is a portion of one array of the memory of FIG. 1.

FIG. 2 is a general schematic diagram of a dynamic digitline memory array layout for the memory array of FIG. 1. The memory array has two sub-arrays 200 and 202 which share a common p-sense amplifier circuit 204, and an n-sense amplifier 205. One capacitive plate of memory cells 206 is coupled to a common plate line 208 or 210, depending upon which sub-array the memory cell is located in. The other capacitive plate of the memory cells are selectively coupled to a digitline 212 or 213 through an access transistor 212. The digitlines and cell plate lines are coupled to the sense amplifier circuitry through isolation transistors 214, 216, 218 and 220. An equilibration transistor 222 is coupled between the sensing nodes of the sense amplifier circuit.

Figure 3:
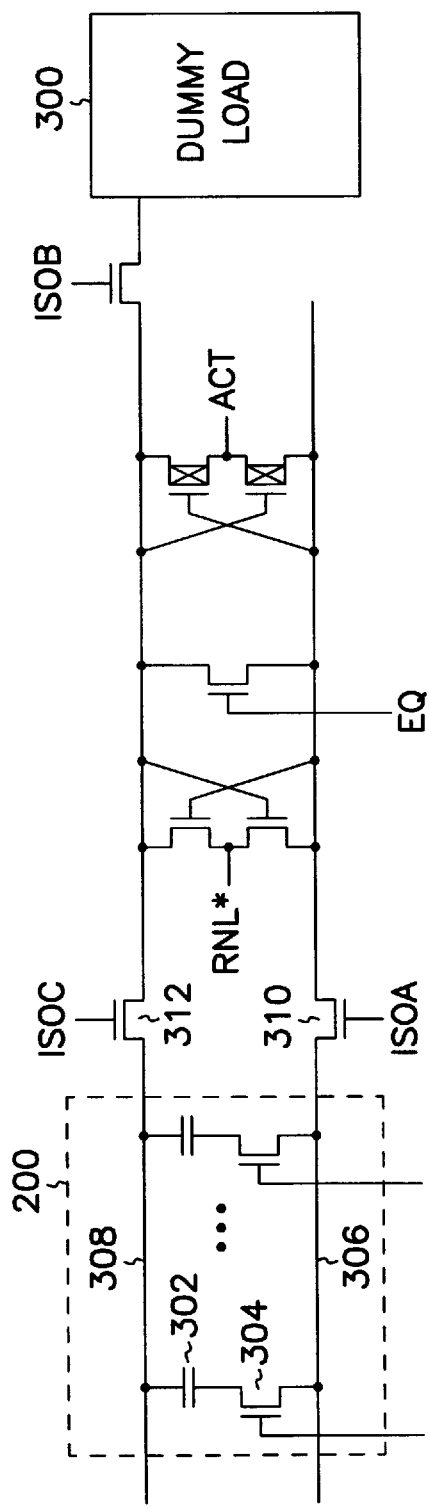
FIG. 3 is a portion of another embodiment of the array of the memory of FIG. 1.

An alternate embodiment of the memory array of FIG. 1 is illustrated in FIG. 3. The portion of the array illustrated is located along an edge of the array. A dummy load 300, or simulation circuit, is provided to simulate a capacitance of a digitline for use as explained below in sensing and equilibration operations. The dummy load can be any circuit which simulates a capacitive load of a typical digitline in the memory, such as a plurality of capacitors.

As described above in the background, a plate of the memory cells can be fabricated as a common plate for the entire array. This common plate is typically maintained at a predetermined voltage level, preferably Vcc/2. It will be recognized by those skilled in the art that if the common plate is used as a reference for a sense amplifier, the reference node of the sense amplifier remains stable during sensing operations prior to activating the sense amplifier. In a dynamic cell plate scheme the cell plates of the memory cells are fabricated in lines, or strips corresponding to the digitlines. When a memory cell is coupled to the digitline for reading data, the corresponding cell plate line is coupled in an opposite direction. The sense amplifier, therefore, will have a larger differential voltage to sense, as described in greater detail below. Thus, lower voltage memory devices can be realized.

Figure 4:
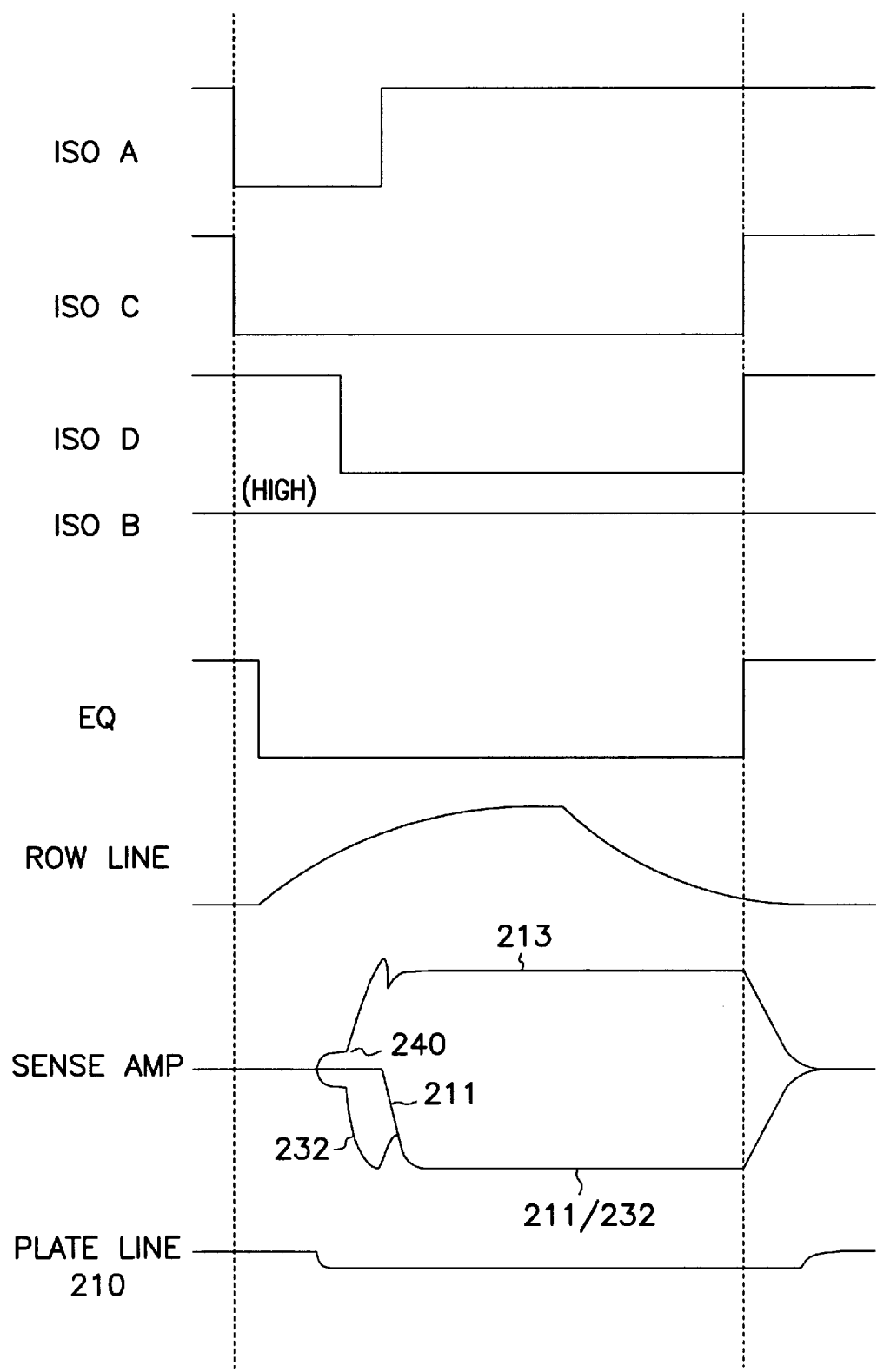
FIG. 4 is a timing diagram of the operation of sensing and equilibration operations.

The operation of the circuit of FIG. 2 is explained as follows with reference to FIG. 4. In operation, to read data stored in a memory cell located in sub-array 202, isolation transistor 218 is activated by providing a high voltage on ISO B to couple digitline 213 with node 230 of the sense amplifiers. Isolation transistors 214 and 216 are turned off by coupling ISO A and ISO C, respectively, to a low voltage. Likewise, equilibrate transistor 222 is deactivated by lowering the EQ signal line.

A row line is selectively driven to a high state to activate an access transistor 212. When the row line signal is a Vt above the equilibrate voltage level of the digitline, a charge stored on the memory cell is shared with the digitline. As illustrated, the voltage on node 230 is slightly elevated. Plate line 210 is coupled low while ISO D is high. This creates a slightly larger differential voltage between nodes 230 and 232 than if a steady plate line were used. The ISO D signal is coupled to a low state to turn off isolation transistor 220 and isolate the plate line for array 202.

As discussed, a signal voltage develops on a digitline 213 when the memory cell access occurs. The sense amplifiers are then activated to detect this signal, see reference 240 in FIG. 4. The p-sense amplifier consists of a cross-coupled PMOS transistor pair and a cross-coupled NMOS transistor pair. The NMOS pair or N-sense-amp common node is labeled RNL* in FIG. 2. The P-sense-amp common node is labeled ACT. Initially, RNL* is biased to Vcc/2 and ACT is biased to VSS or ground. While one sense amplifier node 230 contains charge from the cell access, the other sense amplifier node 232 serves as a reference for the sensing operation. The sense amplifier firing generally occurs sequentially rather than concurrently. The N-sense-amp fires first and the P-sense-amp second. The N-sense-amp is generally a better amplifier than the P-sense-amp because of the higher drive of NMOS transistors and better $V_{th}$ matching. This provides for better sensing characteristics and lower probability of errors.

Dropping the RNL* signal toward ground will fire the N-sense-amp. As the voltage between RNL* and the digitlines approaches $V_{th}$, the NMOS transistor, whose gate connection is to the higher voltage node, will begin to conduct. Transistor conduction occurs first in the subthreshold region, progressing to the saturation region as the gate to source voltage exceeds $V_{th}$. Conduction results in the discharge of the low voltage node toward the RNL* voltage. Ultimately, RNL* will reach ground, bringing the node with it. Note that the other NMOS transistor will not conduct since its gate voltage derives from the low node, which is discharging toward ground.

Shortly after the N-sense-amp fires, ACT will be drive toward Vcc. This activates the P-sense-amp that operates in a complementary fashion to the N-sense-amp. With the low voltage node approaching ground, a strong signal exists to drive the appropriate PMOS transistor into conduction. This conduction, again moving from subthreshold to saturation operation, will charge the high voltage node toward ACT, ultimately reaching Vcc. Since the memory cell transistor remains on during sensing, the memory cell capacitor will charge to the RNL* or ACT voltage level. The voltage, and hence charge, which the memory cell capacitor held prior to accessing will restore a full level—Vcc for a logic one and GND for a logic zero. The minimum wordline voltage is $V_{th}$ above Vcc so that the memory cell capacitor attains a full Vcc level.

After the sense amplifiers are activated to drive digitline 213 high, isolation transistor 214 is activated using signal ISO A. The digitline 211 of inactive array 200, therefore, is connected to the reference node 232 of the sense amplifier circuits. It is noted that node 230 is temporarily coupled low when isolation transistor 214 is activated. The sense amplifier circuit drives digitline 211 to an opposite logic state as that of digitline 213. An inactive digitline as referred to herein is a digitline which does not have a memory cell coupled thereto during a read operation. Thus, the digitline is dormant and is not actively required for a data read operation.

After a sufficient time has passed to perform any desired operation with the data retrieved from the memory cell, the row line is transitioned to a low state to isolate the memory cell from its digitline. Isolation transistors 214, 216, 218 and 220 are all activated. Likewise, equilibrate transistor 222 is activated using the EQ signal. The equilibration step is usually performed during a RAS* precharge time (tRP). The digitlines 211 and 213, and plate lines 208 and 210 are all equilibrated to a voltage of Vcc/2. Thus, a method of equilibrating a memory device having a dynamic digitline architecture is described which uses a capacitance of a digitline in an inactive memory array to create a complement of the active digitline sensed.

The circuit of FIG. 3 can be operated in the same manner as FIG. 2. A memory cell 304 is coupled to the sense amplifiers through transistor 310. The corresponding plate line 308 experiences a change in voltage and is coupled through transistor 312 to the sense amplifiers. The plate line is then isolated and a sense amplifier is activated. The dummy load is coupled to the sense amplifiers and driven to an opposite state as digit line 306. To equilibrate the circuit, the memory cell is isolated and the plate line 308, digit line 306 and the dummy load are coupled together via the equilibrate transistor.

Conclusion

A memory device has been described which uses dynamic digitline sensing where separate plate lines are provided for each digitline. A voltage of the plate line is dynamic in that it changes during read operations to create a larger differential for sensing stored data. A method has been described which uses either an inactive digitline or a simulation circuit to perform an equilibration operation. Thus, the memory uses a digitline for equilibration which is not necessary for data sensing.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory device having dynamic digitlines, the memory device comprising a plurality of memory cell arrays arranged in rows and columns, each column defined by a digitline and a common memory cell plate line, the method comprising the steps of:

sensing data stored in a memory cell located in an active memory array using a differential sense amplifier circuit, the sense amplifier circuit having two sensing nodes, a first node coupled to an active digitline of the active memory array, and a second node coupled to a memory cell plate corresponding to the active digitline;

electrically isolating the memory cell plate line from the second node;

coupling an inactive digitline from an inactive memory array to the second node of the sense amplifier circuit;

driving the inactive digitline to an opposite data state as the active digitline; and electrically coupling the first and second nodes of the sense amplifier circuit to equilibrate the active and inactive digitlines to an intermediate voltage level.

2. The method of claim 1 wherein the step of electrically coupling further includes electrically coupling together an active cell plate line and an inactive cell plate line corresponding to the active and inactive digitlines.

3. The method of claim 1 wherein the step of sensing data further comprises the steps of:

electrically coupling the active digitline to the sense amplifier circuit;

selectively activating a memory cell access transistor to electrically couple a plate of a memory cell to the active digitline;

charge sharing a charge stored on the memory cell with the active digitline; and activating the sense amplifier circuit to drive the active digitline to a logic state corresponding to data stored on the memory cell.

4. The method of claim 1 wherein the common memory cell plate line of a column is precharged to one-half a supply voltage (Vcc/2).

5. A method of operating a memory device comprising an array of memory cells arranged in rows and columns, each column defined by a digitline and a corresponding memory cell plate line conductor strip, the method comprising the steps of:

selectively coupling a memory cell to a digitline through an access transistor:

charge sharing the memory cell with the digitline to modify a voltage of the digitline;

coupling the digitline to a first node of a sense amplifier circuit, coupling a second node of the sense amplifier circuit to a memory cell plate corresponding to the active digitline;

activating the sense amplifier circuit to drive the digitline to a voltage level representing data stored on the memory cell;

electrically isolating the memory cell plate line from the second node of the sense amplifier circuit;

coupling a dummy load to the second node of the sense amplifier, the dummy load having a capacitance substantially equal to a capacitance of the digitline;

driving a voltage of the dummy load to a voltage level representing an opposite data state of the data stored on the memory cell;

deactivating the sense amplifier circuit;

coupling the memory cell plate line conductor strip corresponding to the digitline to the second node of the sense amplifier circuit; and equilibrating the digitline, dummy load and the memory cell plate line conductor strip to a common voltage using an equilibrate transistor coupled to the first and second nodes of the sense amplifier circuit.

6. The method of claim 5 wherein the memory is a dynamic random access memory (DRAM).

7. The method of claim 5 wherein the dummy load is a inactive digitline.

8. A method of operating a dynamic random access memory (DRAM), the DRAM comprising a differential sense amplifier having first and second sensing nodes, first digitline selectively coupleable to the first sensing node through a first isolation transistor, a second digitline selectively coupleable to the second sensing node through a second isolation transistor, a first common plate line associated with the first digitline such that all memory cell capacitors coupleable to the first digitline share a common capacitive plate, a second common plate line associated with the second digitline such that all memory cell capacitors coupleable to the second digitline share a common capacitive plate, a third isolation transistor connected between the first common plate line and the second node, and a forth isolation transistor connected between the second common plate line and the first node, the method comprising the steps in the order of:

activating the first and third isolation transistors to couple the first digitline to the first sensing node and the first common plate line to the second sensing node;

deactivating the second and fourth isolation transistors;

deactivating an equilibrate transistor coupled between the first and second nodes;

providing a signal on a row line to activate a memory cell access transistor to couple a memory cell to the first digitline, such that a charge stored on the memory cell is shared with the first digitline and a voltage of the first common plate line changes in an opposite direction of a voltage change in the first digitline;

deactivating the third isolation transistor to decoupled the first common plate line from the second sensing node;

activating the differential sense amplifier to sense and amplify a differential voltage between the first and second sensing nodes;

activating the second isolation transistor to drive the second digitline to an opposite voltage level of the first digitline;

deactivating the memory cell access transistor;

activating the first, third and fourth isolation transistors; and activating the equilibrate transistor.

9. A method of operating a dynamic random access memory (DRAM), the DRAM comprising a differential sense amplifier having first and second sensing nodes, first digitline selectively coupleable to the first sensing node through a first isolation transistor, a simulation circuit selectively coupleable to the second sensing node through a second isolation transistor, a first common plate line associated with the first digitline such that all memory cell capacitors coupleable to the first digitline share a common capacitive plate, and a third isolation transistor connected between the first common plate line and the second node, the method comprising the steps in the order of:

activating the first and third isolation transistors to couple the first digitline to the first sensing node and the first common plate line to the second sensing node;

deactivating the second isolation transistor;

deactivating an equilibrate transistor coupled between the first and second nodes;

providing a signal on a row line to activate a memory cell access transistor to couple a memory cell to the first digitline, such that a charge stored on the memory cell is shared with the first digitline and a voltage of the first common plate line changes in an opposite direction of a voltage change in the first digitline;

deactivating the third isolation transistor to decoupled the first common plate line from the second sensing node;

activating the differential sense amplifier to sense and amplify a differential voltage between the first and second sensing nodes;

activating the second isolation transistor to drive the simulation circuit to an opposite voltage level of the first digitline;

deactivating the memory cell access transistor;

activating the first, and third isolation transistors; and activating the equilibrate transistor.

* * * * *